(12) United States Patent
Kuo et al.

(10) Patent No.: US 8,049,327 B2
(45) Date of Patent: Nov. 1, 2011

(54) THROUGH-SILICON VIA WITH SCALLOPED SIDEWALLS

(75) Inventors: Chen-Cheng Kuo, Chu-Pei (TW); Chih-Hua Chen, Jhubei (TW); Ming-Fa Chen, Taichung (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 339 days.

(21) Appl. No.: 12/348,650

(22) Filed: Jan. 5, 2009

(65) Prior Publication Data

US 2010/0171223 A1 Jul. 8, 2010

(51) Int. Cl.
*H01L 23/04* (2006.01)
(52) U.S. Cl. .. 257/698; 257/621; 257/774; 257/E23.011
(58) Field of Classification Search .................. 257/698, 257/E23.011, 621, 622, 773, 774; 438/667
See application file for complete search history.

(56) References Cited

U.S. PATENT DOCUMENTS

2006/0046463 A1* 3/2006 Watkins et al. ............... 438/622
2009/0093117 A1* 4/2009 Taguchi et al. ............... 438/667
* cited by examiner

*Primary Examiner* — Matthew Smith
*Assistant Examiner* — Quovaunda V Jefferson
(74) *Attorney, Agent, or Firm* — Slater & Matsil, L.L.P.

(57) ABSTRACT

A semiconductor device having one or more through-silicon vias (TSVs) is provided. The TSVs are formed such that sidewalls of the TSVs have a scalloped surface. In an embodiment, the sidewalls of the TSVs are sloped wherein a top and bottom of the TSVs have different dimensions. The TSVs may have a V-shape wherein the TSVs have a wider dimension on a circuit side of the substrate, or an inverted V-shape wherein the TSVs have a wider dimension on a backside of the substrate. The scalloped surfaces of the sidewalls and/or sloped sidewalls allow the TSVs to be more easily filled with a conductive material such as copper.

20 Claims, 13 Drawing Sheets

THROUGH-SILICON VIA WITH SCALLOPED SIDEWALLS

TECHNICAL FIELD

This invention relates generally to semiconductor devices and, more particularly, to through-silicon vias.

BACKGROUND

Since the invention of the integrated circuit (IC), the semiconductor industry has experienced sustained rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, TSVs are formed by etching a vertical via through a substrate and filling the via with a conductive material, such as copper. The TSVs may be used to provide an electrical contact on a backside of the semiconductor substrate to semiconductor circuitry on an opposing side of the substrate or another die. In this manner, dies may be stacked while maintaining a smaller package size.

The conductive material of the TSV, however, may exhibit a tendency to delaminate from the sidewalls of the TSVs or slide during high-low temperature cycles or thermal shock tests, thereby reducing the reliability of the TSVs. Furthermore, filling the via with a conductive material requires forming a barrier layer and/or a seed layer on the vertical sidewalls of the via. Due to the vertical nature of the sidewalls, however, it may be difficult to form a barrier layer and/or a seed layer with good adhesive properties and, as a result, difficult to fill the TSV.

Accordingly, there is a need for a TSV that reduces or prevents these issues.

SUMMARY OF THE INVENTION

These and other problems are generally reduced, solved or circumvented, and technical advantages are generally achieved, by embodiments of the present invention, which provides through-silicon vias having a scalloped surface.

In accordance with an embodiment of the present invention, a semiconductor device is provided. The semiconductor device includes a substrate having one or more dielectric layers overlying the substrate. TSVs extend through the substrate wherein sidewalls of the substrate have a scalloped surface wherein the scallops have a depth of greater than about 0.01 um.

In accordance with another embodiment of the present invention, a method of forming a semiconductor device is provided. The method includes providing a substrate and forming electronic circuitry on the substrate. One or more dielectric layers are formed over the substrate and one or more metal lines are formed in the one or more dielectric layers. TSVs having scalloped sidewalls are formed extending from a first side of the substrate to a second side of the substrate. The TSVs are formed at least in part by repeatedly performing an isotropic etch to form a recess and forming a protective liner along sidewalls of the recess, wherein the scallops have a depth of greater than about 0.01 um In accordance with yet another embodiment of the present invention, a semiconductor device is provided. The semiconductor device includes a substrate having one or more dielectric layers overlying the substrate. A through-silicon via (TSV) extends through the substrate, wherein the TSV has a plurality of scalloped regions such that a width of the TSV in each scalloped region is smaller than a width of the TSV in a previous scalloped region as the TSV extends from a first side of the substrate to a second side of the substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
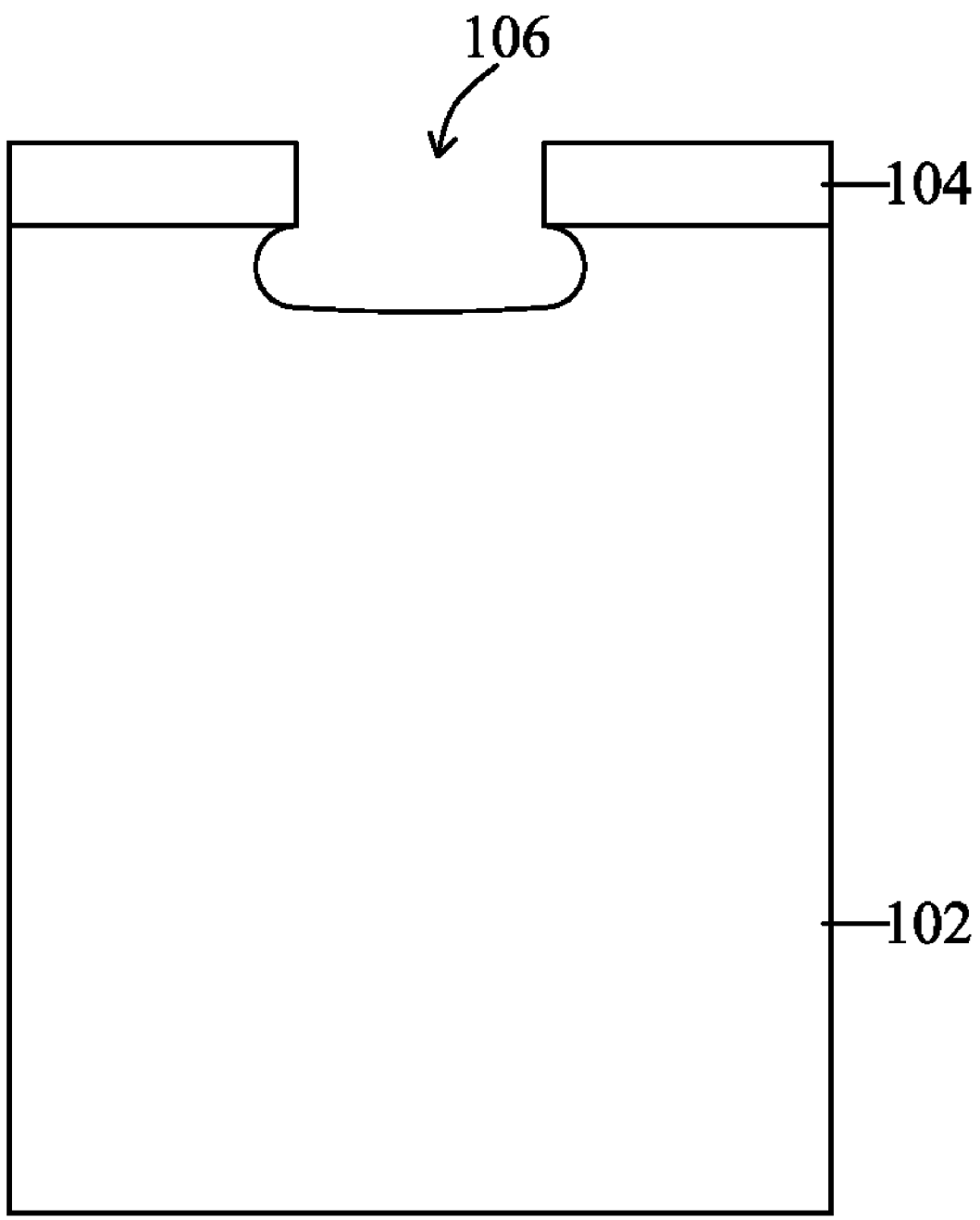
FIGS. 1-4 illustrate intermediate stages in forming a through-silicon via having scalloped sidewalls.

FIGS. 1-4 illustrate various intermediate steps in forming a through-silicon via (TSV) in accordance with an embodiment of the present invention. Referring first to FIG. 1, there is shown a portion of a substrate 102 with an overlying patterned mask 104. The substrate 102 may include only a semiconductor substrate, a semiconductor substrate with semiconductor devices (e.g., transistors, capacitors, resistors, etc.), a semiconductor substrate with semiconductor devices and one or more overlying dielectric layers and/or metallization layers, or the like. FIGS. 1-4 are meant to illustrate a method of forming a TSV, and not necessarily limit the location or the layers through which the TSV is formed.

The patterned mask 104 defines the pattern of TSVs (one in the illustrated embodiment) and may comprise a patterned photoresist layer. In another embodiment, the patterned mask 104 may comprise a hard mask of one or more dielectric layers. For example, the hard mask may be a layer of a silicon dioxide or a silicon nitride formed by, for example, thermal oxidation, chemical vapor deposition (CVD), or the like. Alternatively, the hard mask may be formed of other dielectric materials, such as silicon oxynitride. A multi-layer hard mask, such as layers of silicon dioxide and silicon nitride, may also be used. Furthermore, other materials, such as a metal, a metal nitride, a metal oxide, or the like, may be used. For example, the hard mask may be formed of tungsten.

As illustrated in FIG. 1, the patterned mask 104 is subsequently patterned using, for example, photolithography techniques known in the art. Generally, photolithography techniques involve depositing a photoresist material and irradiating the photoresist material in accordance with a pattern. Thereafter, the photoresist material is developed to remove a portion of the photoresist material. The remaining photoresist material protects the underlying material during subsequent processing steps, such as etching. In this case, the photoresist material is utilized to create the patterned mask 104 to define a first recess 106 (which will become a TSV as discussed below).

Once the patterned mask 104 is formed, alternating processes of etching and depositing a protective liner are repeated. The process is preferably an isotropic dry etch process, such as a Bosch process. As a result of using an isotropic etch process (as opposed to an anisotropic etch process), a recess that extends laterally as well as vertically is formed, thereby creating an undercut region. Generally, a Bosch process involves introducing a first gas that etches the substrate 102 until the desired depth of the recess is reached, at which point the first gas is stopped and a second gas is introduced that creates a protective liner along the surface of the sidewalls. When the first gas is reintroduced, the first gas removes the protective liner along the bottom of the recess (leaving the protective liner along the sidewalls) and continues etching the substrate along the bottom of the recess. The process of introducing the first gas and the second gas is repeated until the desired depth is achieved. The Bosch process has been used to create vertical sidewalls. In embodiments of the present invention, a variation of the Bosch process is used to create a TSV having scalloped sidewalls.

For example, an etching gas, such as $SF_6$, is introduced at a flow rate of about 50 sccm to about 250 sccm at a pressure of about 10 mTorr to about 100 mTorr and at power of about 100 Watts to about 3500 Watts and at a temperature of about 25° C. to about 100° C. for a time period between about 1 second to about 7 seconds to form a recess as illustrated in FIG. 1. This process results in an isotropic etch that etches laterally as well as vertically, creating an undercut region as illustrated in FIG. 1.

Figure 2:
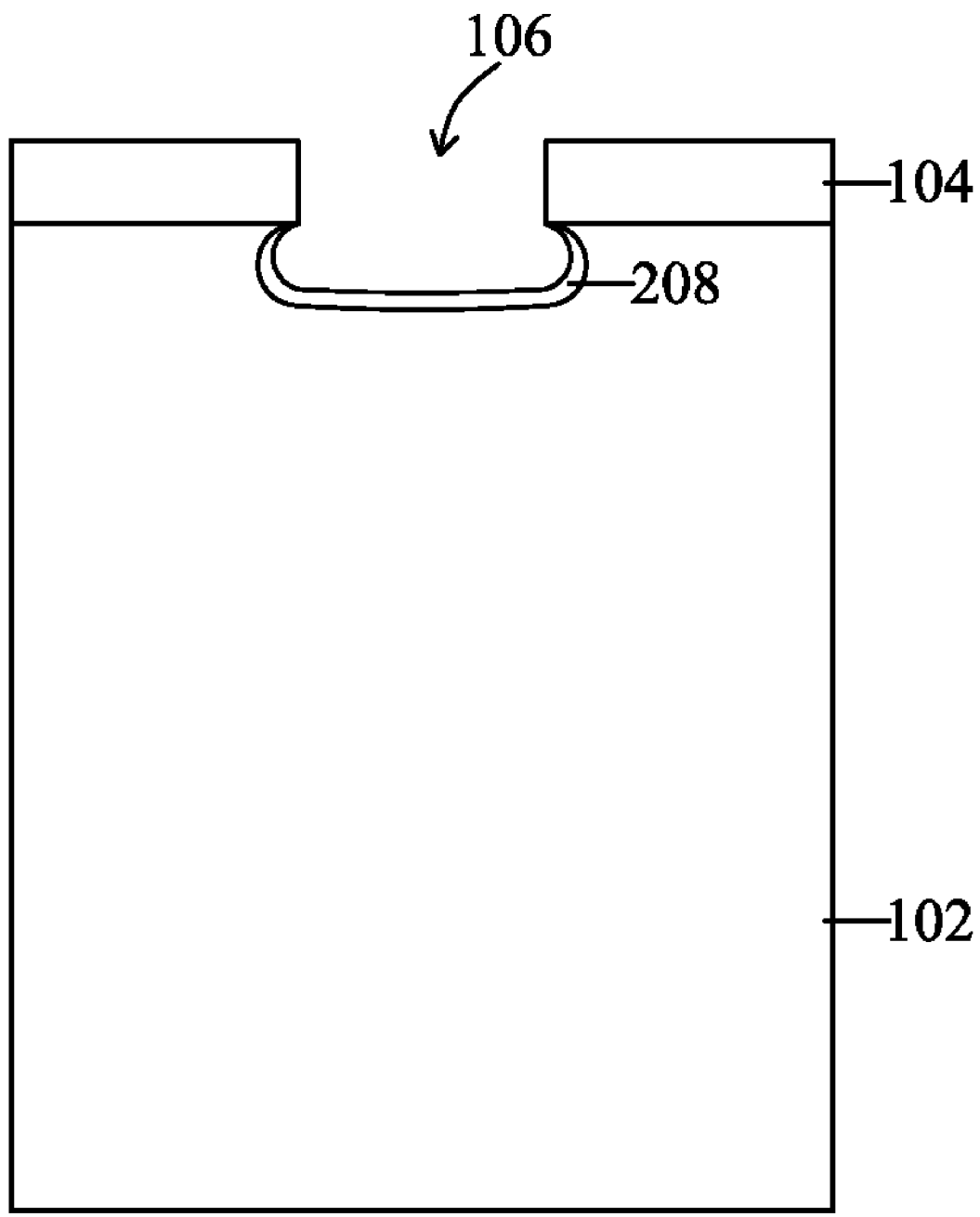

Thereafter, as illustrated in FIG. 2, a protective liner 208, such as a polymer, may be formed by introducing a $C_4F_8$ gas at a flow rate of about 100 sccm to about 300 sccm at a pressure of about 10 mTorr to about 50 mTorr and at power of about 1000 Watts to about 3500 Watts and at a temperature of about 25° C. to about 100° C. for a time period between about 1 second to about 10 seconds.

Figure 3:
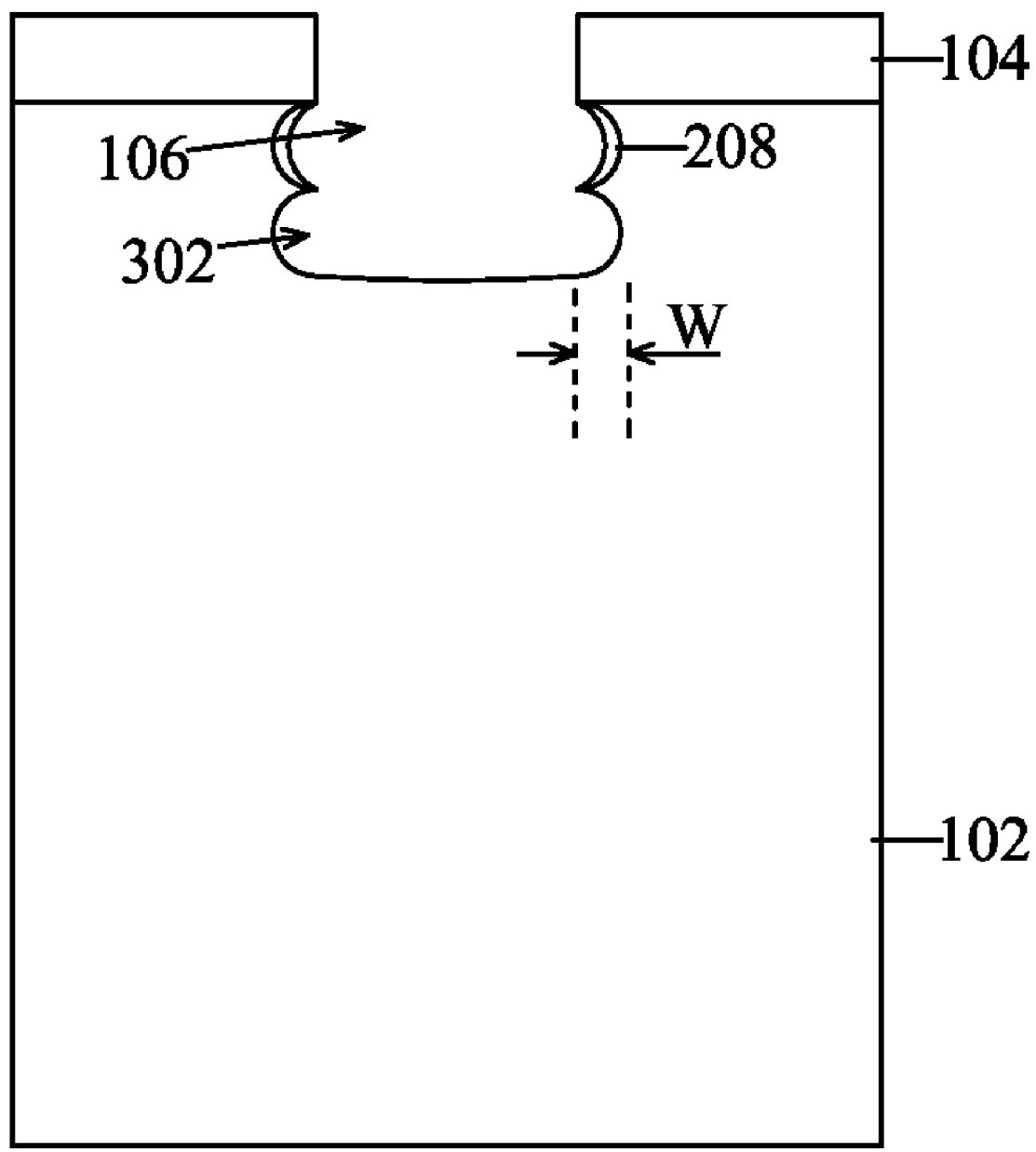

Next, in FIG. 3, the etching gas is reintroduced using similar process parameters as discussed above with reference to FIG. 1. In this case, the etching gas removes the protective liner 208 along the bottom surface and performs another isotropic etch process. As in the case of the first etch process, the isotropic etch process causes a second recess 302 to extend laterally as well as vertically, thereby creating another undercut region. As a result, the combination of the first recess 106 and the second recess 302 creates an uneven or scalloped surface. Preferably, the scallop feature has a width w between about 0.01 μm and about 5 μm. It has been found that scallops of this size create greater friction and reduce or eliminate TSV voids after metal filling.

Figure 4:
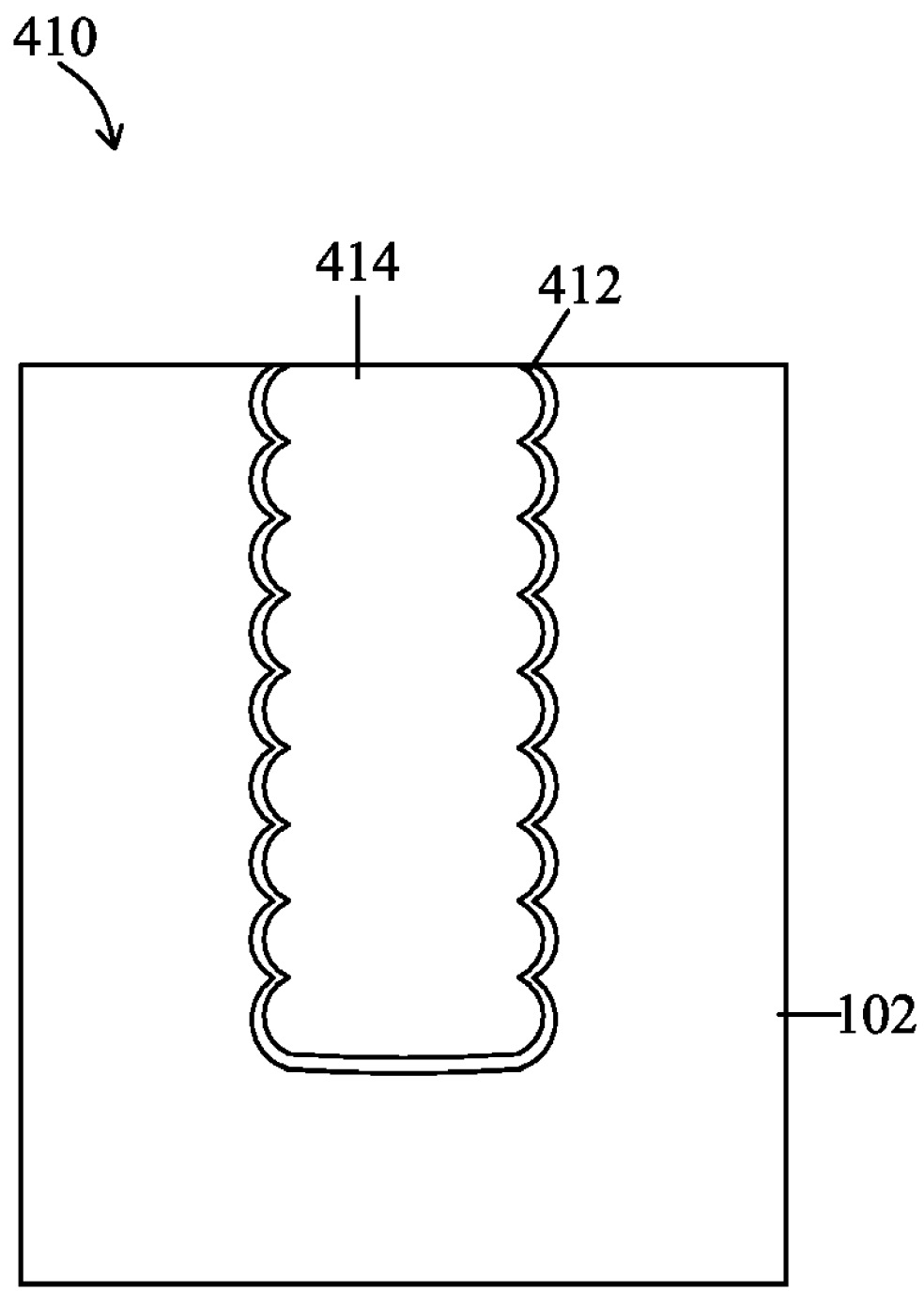

As illustrated in FIG. 4, the process described above may be repeated any number of times to create an opening of the desired depth. After forming the opening to the desired depth, the protective liner 208 (see FIG. 3) is removed and the opening may be filled with a conductive material to form a TSV 410. Preferably, a barrier layer 412 is deposited along sidewalls of the opening to create a diffusion barrier to prevent the conductive material, such as copper, from diffusing into the substrate 102 and/or one or more dielectric layers. The barrier layer 412 may comprise a dielectric and/or conductive barrier layer, such as a nitrogen-containing layer, a carbon-containing layer, a hydrogen-containing layer, a silicon-containing layer, a metal or metal-containing layer doped with an impurity (e.g., boron), such as tantalum, tantalum nitride, titanium, titanium nitride, titanium zirconium, titanium zirconium nitride, tungsten, tungsten nitride, cobalt boron, cobalt tungsten, an alloy, combinations thereof, or the like. The barrier layer 412 may be formed, for example, by physical vapor deposition (PVD), atomic layer deposition (ALD), spin-on deposition, or other suitable methods. The barrier layer 412 may have a thickness between about 50 Å and about 50,000 Å.

After the barrier layer 412 is formed, a conductive material 414 is used to form the TSV 410. The conductive material may be, for example, copper, tungsten, aluminum, silver, combinations thereof, or the like. In an embodiment, a seed layer (not shown) is formed over the barrier layer 412, and an electro-deposition process is utilized to fill the opening, although other suitable methods, such as electroless deposition, plating, or CVD, may also be used. The process may include overfilling the opening and removing excess conductive material located outside of the TSV openings using, for example, a process such as chemical mechanical polishing (CMP), etching, combinations thereof, or the like.

It has been found that vertical or nearly vertical TSVs having smooth sidewalls provide a surface that is not optimal for forming a seed layer and/or filling the TSV. To overcome these deficiencies and to provide a better surface upon which a seed layer may be formed, embodiments of the present invention utilize sidewalls having a scalloped surface as described above. It has been found that the scalloped sidewalls provide a better surface upon which a seed (or other) layer may be formed by increasing the friction and adhesion, thereby improving the reliability of the connection.

Thereafter, other back-end-of-line (BEOL) processing techniques suitable for the particular application may be performed. For example, a carrier substrate may be attached and/or removed, the backside of the wafer may be thinned to expose the TSV 410, a singulation process may be performed to singulate individual dies, and the like, may be performed. It should also be noted that embodiments of the present invention may be used in many different situations, such as a die-to-die bonding configuration, a die-to-wafer bonding configuration, or a wafer-to-wafer bonding configuration.

Figure 5:
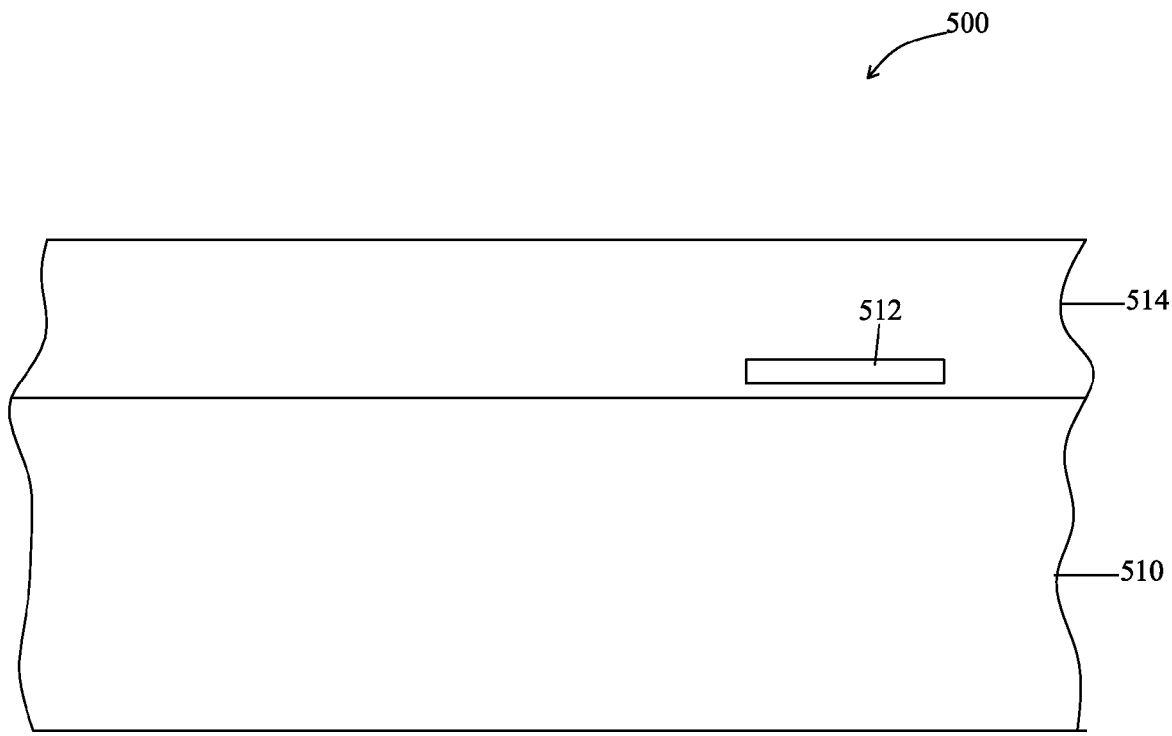
FIGS. 5-8 illustrate intermediate stages in forming a semiconductor device having through-silicon vias in accordance with an embodiment of the present invention.

FIGS. 5-8 illustrate various intermediate steps in forming a TSV, such as the TSV discussed above with reference to FIGS. 1-4, in accordance with an embodiment of the present invention. Referring first to FIG. 5, a portion of a wafer 500 comprising a semiconductor substrate 510 having electrical circuitry 512 formed thereon is shown. The semiconductor substrate 510 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 512 formed on the semiconductor substrate 510 may be any type of circuitry suitable for a particular application. In an embodiment, the circuitry includes electrical devices formed on the substrate with one or more dielectric layers, such as one or more dielectric layers 514, overlying the electrical devices. Metal layers (not shown in FIG. 5) may be formed between dielectric layers to route electrical signals between the electrical devices. Electrical devices may also be formed in the one or more dielectric layers 514. The one or more dielectric layers 514 may include one or more interlayer dielectric (ILD) layers and/or inter-metal dielectric (IMD) layers.

For example, the electrical circuitry 512 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application. Vias, contacts, and/or metal lines (not shown) may be used to interconnect the electrical circuitry 512.

Figure 6:
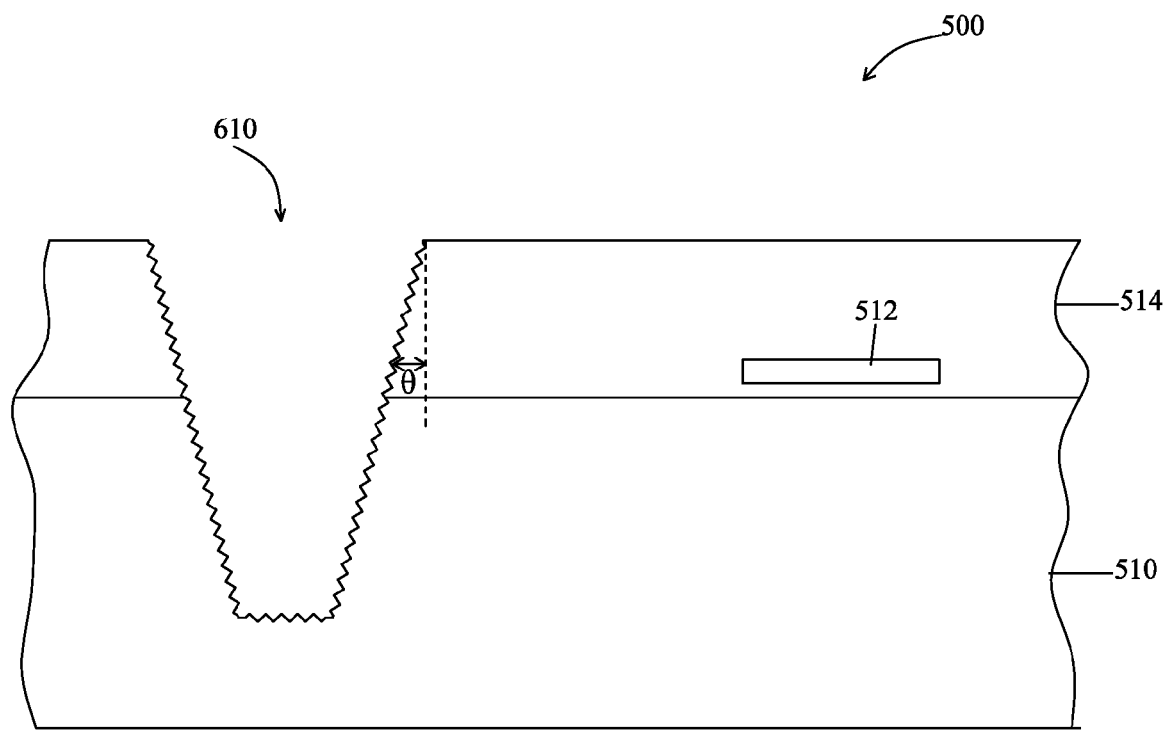

FIG. 6 illustrates forming an opening 610 in accordance with an embodiment of the present invention. The opening 610 may be formed by utilizing techniques discussed above with reference to FIGS. 1-4, namely, using photolithography techniques and repeatedly performing an isotropic etch and depositing a protective layer (e.g., a polymer) in the recess to create the opening 610 having scalloped sidewalls.

In the embodiment illustrated in FIG. 6, however, the opening 610 has sidewalls sloped inward, thereby forming a V-shaped opening. The slope of the opening 610 preferably has an angle from about 0 degrees to about 30 degrees relative to a line normal to the surface of the one or more dielectric layers 514 and the semiconductor substrate 510, represented by the angle θ in FIG. 6, but more preferably, the angle θ is greater than about 0.5 degrees. The sloped sidewalls may be created by changing etching and polymer deposition time interval. For example, by gradually reducing etching time interval about 5% to 40% and increasing polymer deposition time interval about 5% to 40%.

As noted above, the scalloped sidewalls provide a better surface upon which a seed layer may be formed. It has also been found that sloping the sidewalls may further increase the ability to form a seed (or other) layer along the sidewalls. Thus, as discussed above, the opening 610 is formed with scalloped and sloped sidewalls to further aid in the formation of a seed layer in subsequent processing steps.

Figure 7:
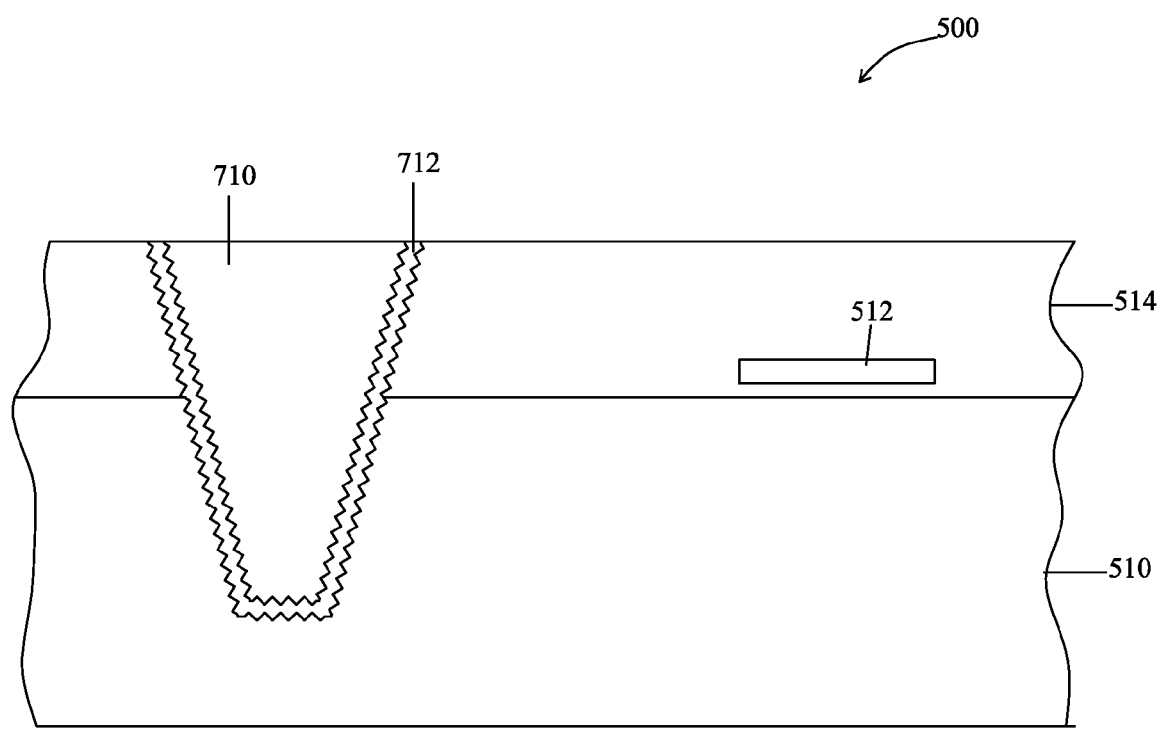

Continuing with FIG. 7, there is illustrated the process of forming a TSV 710 by filling the opening 610 (see FIG. 6) with a conductive material in accordance with an embodiment of the present invention. A barrier layer 712 is preferably deposited along sidewalls of the opening 610 prior to filling the opening 610 in order to create a diffusion barrier to prevent the conductive material, such as copper, from diffusing into the semiconductor substrate 510 or the one or more dielectric layers 514. The barrier layer 712 may comprise a dielectric or conductive barrier layer, such as a nitrogen-containing layer, a carbon-containing layer, a hydrogen-containing layer, a silicon-containing layer, a metal or metal-containing layer doped with an impurity (e.g., boron), such as tantalum, tantalum nitride, titanium, titanium nitride, titanium zirconium, titanium zirconium nitride, tungsten, tungsten nitride, cobalt boron, cobalt tungsten, an alloy, combinations thereof, or the like. The barrier layer 712 may be formed, for example, by PVD, ALD, spin-on deposition, or other suitable methods. The barrier layer 712 may have a thickness between about 50 Å and about 50,000 Å.

The conductive material used to form the TSV 710 preferably comprises copper, although other conductive materials, such as tungsten, aluminum, silver, and combinations thereof, may alternatively be used. Preferably, a seed layer (not shown) is formed over the barrier layer 712, and an electro-deposition process is utilized to fill the opening 610, although other suitable methods, such as electroless deposition, plating, or CVD, may also be used. The process may include overfilling the opening 610 and removing excess conductive material located outside of the TSV openings using, for example, a process such as CMP, etching, combinations thereof, or the like.

Figure 8:
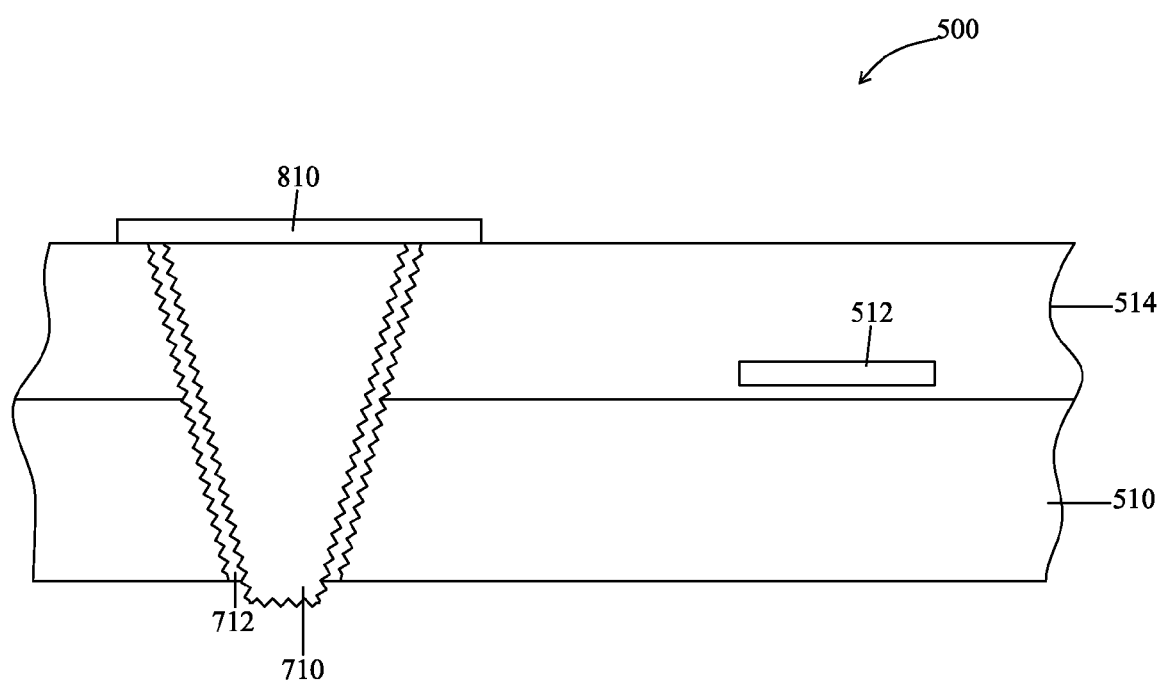

FIG. 8 illustrates forming additional layers over the TSV 710 in accordance with an embodiment of the present invention. For illustrative purposes, a metal layer 810 is shown that provides electrical contact to the TSV 710, but it should be understood that multiple metal layers and inter-metal dielectric layers may be used.

Also illustrated in FIG. 8 is the exposing of the TSV 710 on the backside of the semiconductor substrate 510. In a preferred embodiment, the TSV 710 is exposed using a combination of planarizing and etching steps. Initially, a planarizing process, such as grinding or a CMP, may be performed to initially expose the TSV 710. Thereafter, an etching process may be performed to recess the semiconductor substrate 510, thereby leaving the TSV 710 protruding from the backside of the semiconductor substrate 510 as illustrated in FIG. 8. In an embodiment in which the TSV 710 is formed of copper, the semiconductor substrate 510 may be recessed by performing a wet etch or dry etch process using $HBr/O_2$, $HBr/Cl_2/O_2$, $SF_6/CL_2$, $SF_6$ plasma, or the like.

Thereafter, other BEOL processing techniques suitable for the particular application may be performed. For example, wafer-to-wafer, wafer-to-die, or die-to-die bonding techniques may be used, redistribution lines may be formed, passivation layers may be formed, an encapsulant may be formed, a singulation process may be performed, and the like.

Figure 9:
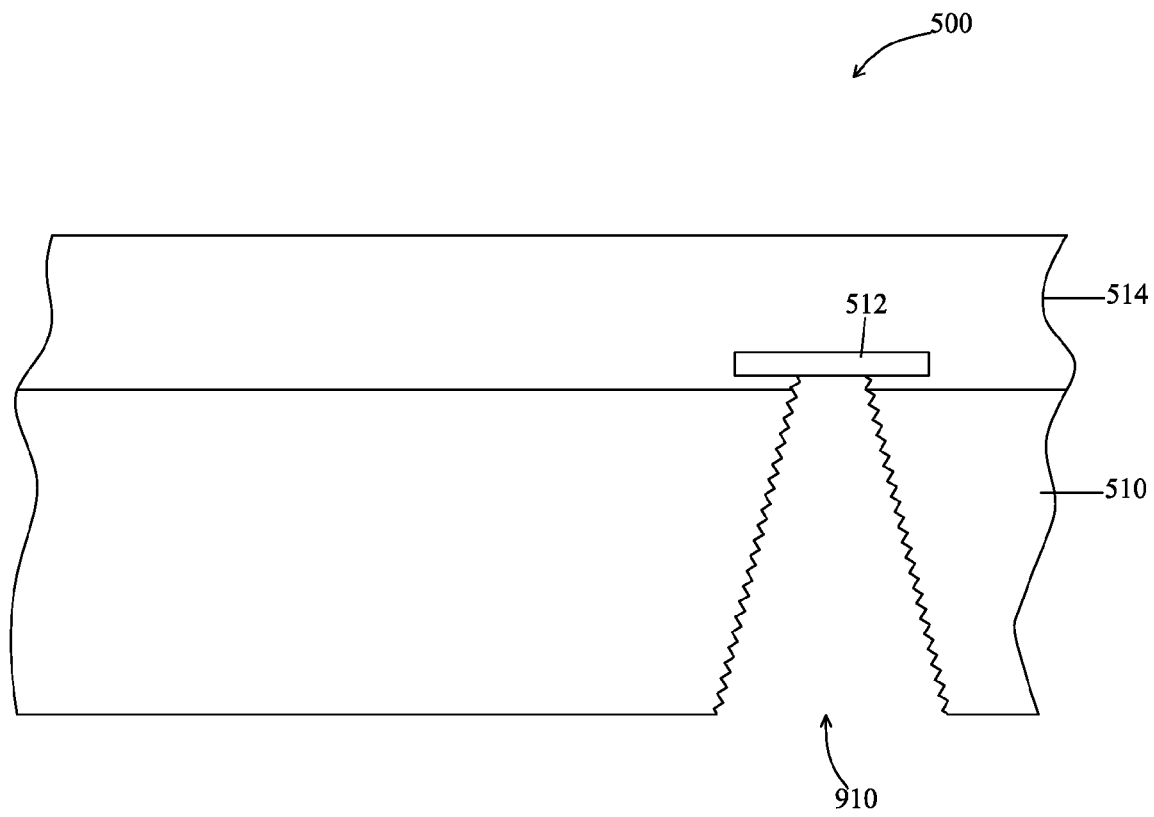
FIGS. 9-11 illustrate intermediate stages in forming a semiconductor device having through-silicon vias in accordance with another embodiment of the present invention.
Figure 10:
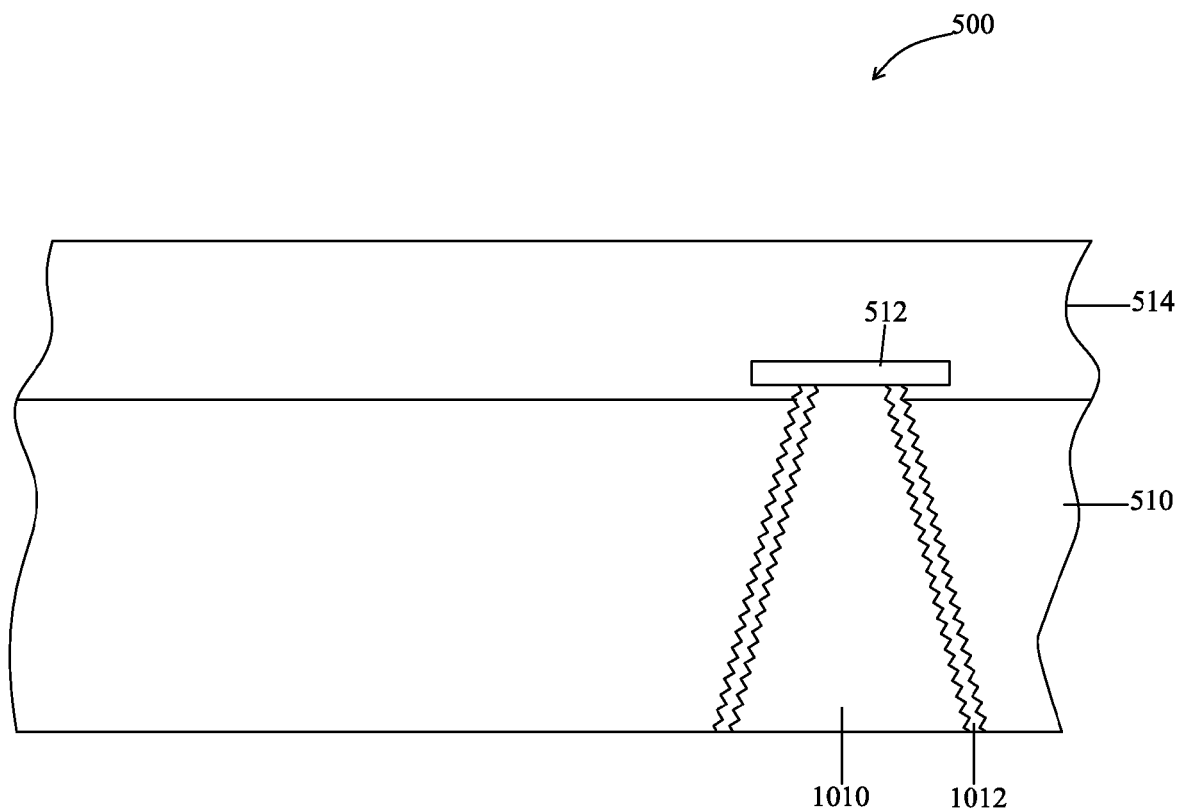

FIGS. 9-10 illustrate another embodiment of forming a TSV, wherein the TSV has an inverted-V shape. FIGS. 9-10 assume a wafer as discussed above with reference to FIG. 5, wherein like reference numerals refer to like elements.

As will be discussed in greater detail below, this embodiment forms the TSV from the backside (side of substrate opposite the electronic circuitry) of the semiconductor substrate 510. In contrast to the timed etch process utilized in the embodiment discussed above with reference to FIGS. 1-8, the etch process used to form the TSV in this embodiment will utilize a feature of the electronic circuitry, such as a gate electrode, capacitor plate, or the like, as an etch stop. It should be noted, however, that the feature of the electronic circuitry preferably has a high etch selectivity compared to the surrounding material.

Referring now to FIG. 9, an opening 910 having an inverted-V shape formed from the backside of the semiconductor substrate 510 is shown. The opening 910 may be formed in a similar manner as the opening 610 discussed above with reference to FIG. 7, e.g., using similar photolithography techniques, etch processes, and the like, except, as noted above, the etch process uses the electronic circuitry 512 as an etch stop. In a preferred embodiment, the electronic circuitry is a gate electrode, capacitor plate, or the like, formed of a material having a high-etch selectivity to the semiconductor substrate 510 and/or the one or more dielectric layers 514.

It should also be noted that the electronic circuitry 512 is illustrated as being formed in the one or more dielectric layers 514 for illustrative purposes only. In other embodiments, the electronic circuitry may be formed in the semiconductor substrate 510 or in a recess in the semiconductor substrate 510.

FIG. 10 illustrates forming a TSV 1010 by filling the opening 910 (see FIG. 9) with a conductive material in accordance with an embodiment of the present invention. A barrier layer 1012 may be formed along the sidewalls of the opening 910 prior to filling the opening 910. The TSV 1010 and the barrier layer 1012 may be formed using similar processes as discussed above with reference to FIG. 7 and the TSV 710 and the barrier layer 712.

Figure 11:
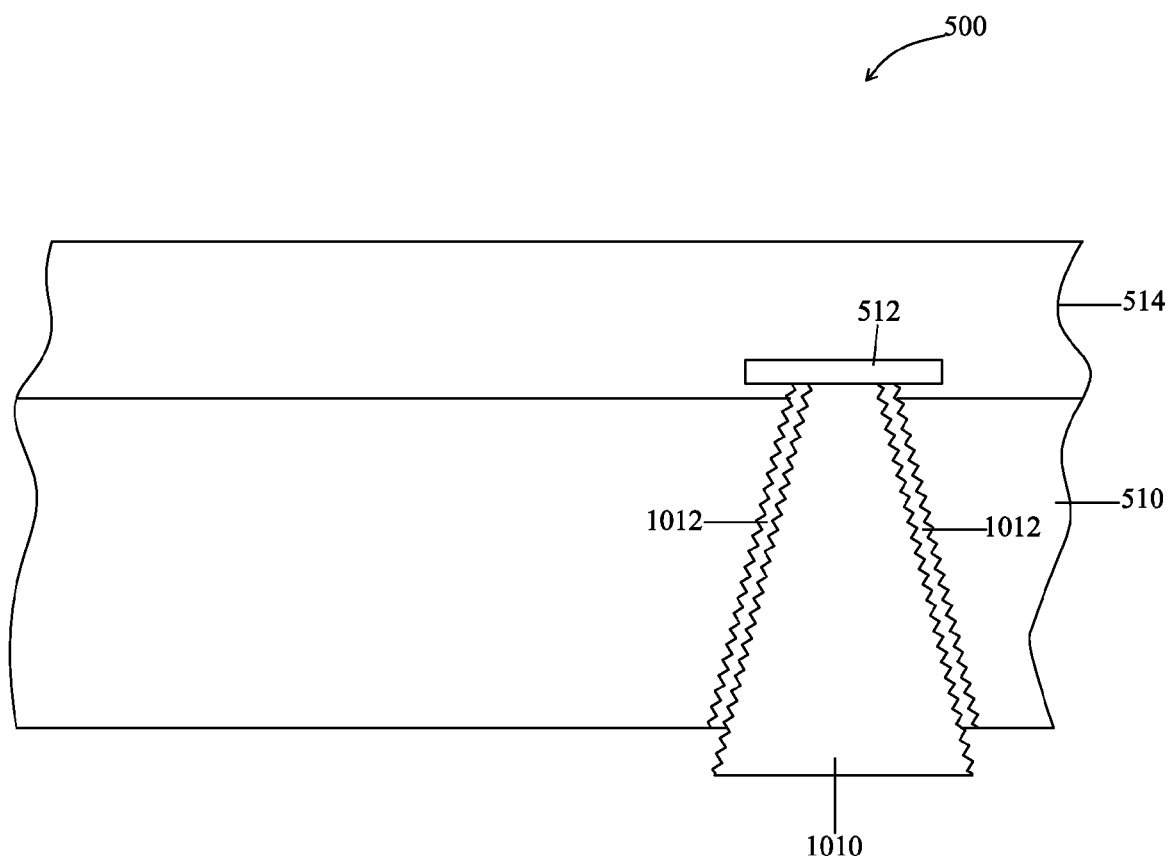

FIG. 11 illustrates an optional exposure of the TSV 1010 such that the TSV 1010 protrudes from the backside of the semiconductor substrate 510. An etching process may be performed to recess the semiconductor substrate 510, thereby leaving the TSV 1010 protruding from the backside of the semiconductor substrate 510 as illustrated in FIG. 11. In an embodiment in which the TSV 1010 is formed of copper, the semiconductor substrate 510 may be recessed by performing a dry etch process as described above.

Thereafter, other BEOL processing techniques suitable for the particular application may be performed. For example, wafer-to-wafer, wafer-to-die, or die-to-die bonding techniques may be used, redistribution lines may be formed, passivation layers may be formed, an encapsulant may be formed, a singulation process may be performed, and the like.

Figure 12:
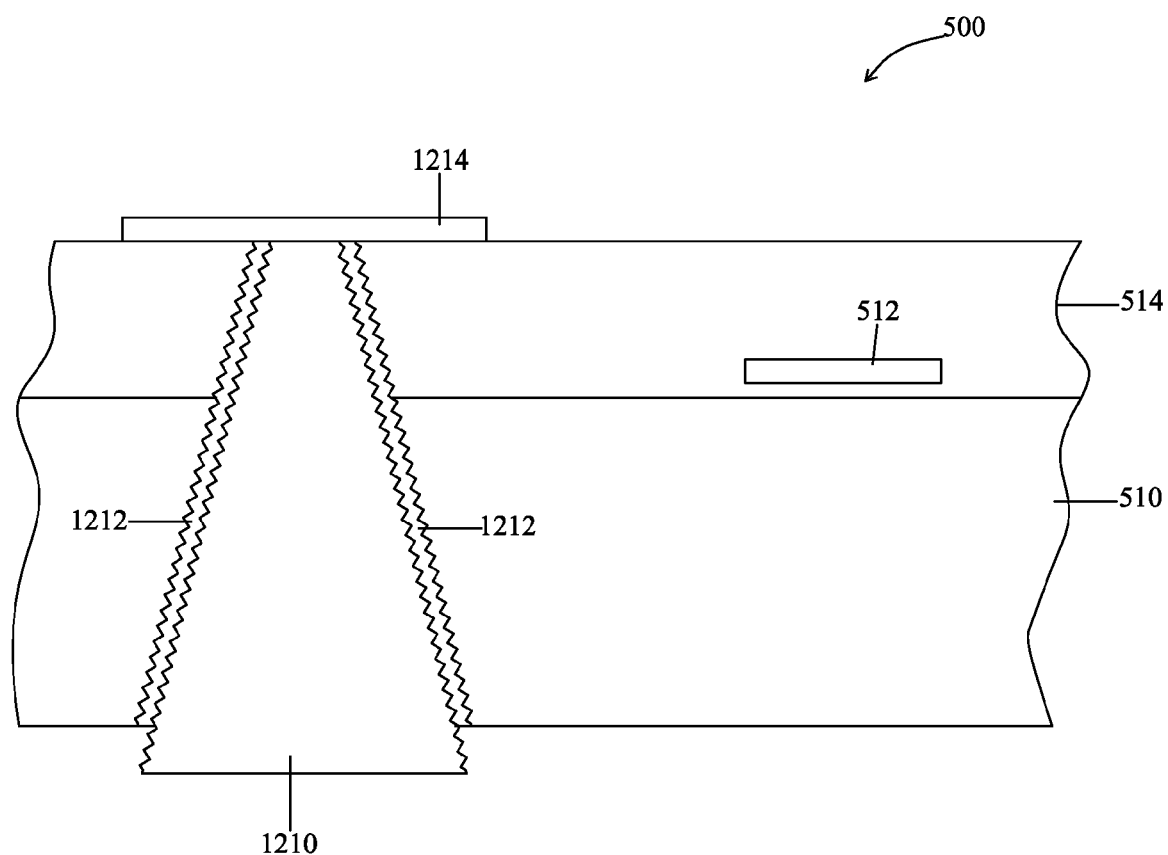
FIG. 12 illustrates an intermediate stage in forming a semiconductor device having through-silicon vias in accordance with yet another embodiment of the present invention.

FIG. 12 illustrates another embodiment in which an inverted-V shaped TSV 1210 and a barrier layer 1212 are formed. This embodiment is similar to the embodiment discussed above with reference to FIGS. 9-11, except a metal line 1214 is used as an etch stop rather than the electronic circuitry 512 (see FIG. 11). The metal line 1214 may be a metal line on any metal layer (M1, M2, M3, or the like). Similar processes and/or materials may be used to form the TSV 1210 and the barrier layer 1212, including an etch-back process to protrude the TSV 1210 from a surface of the substrate 510, as discussed above with reference to FIGS. 9-11.

Thereafter, other BEOL processing techniques suitable for the particular application may be performed. For example, wafer-to-wafer, wafer-to-die, or die-to-die bonding techniques may be used, redistribution lines may be formed, passivation layers may be formed, an encapsulant may be formed, a singulation process may be performed, and the like.

Figure 13:
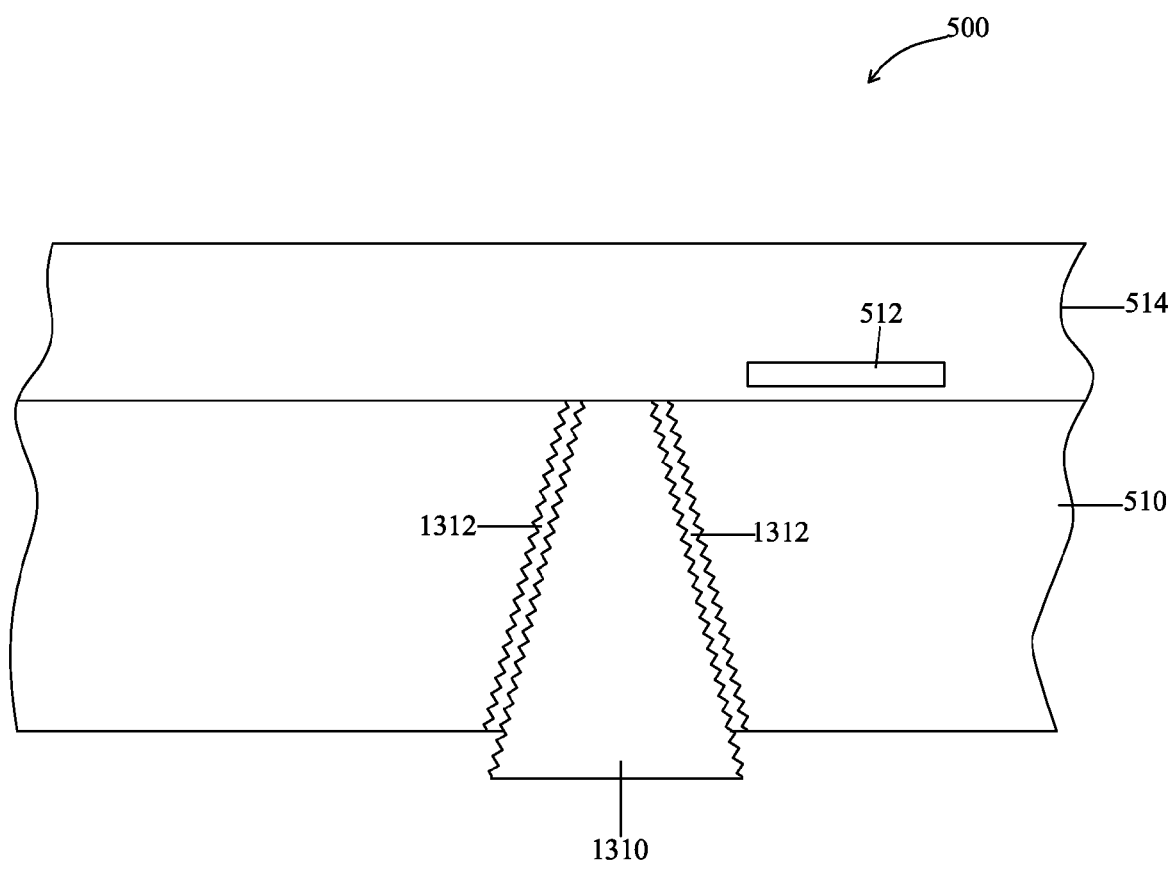
FIG. 13 illustrates an intermediate stage in forming a semiconductor device having through-silicon vias in accordance with yet another embodiment of the present invention.

FIG. 13 illustrates yet another embodiment in which an inverted-V shaped TSV 1310 is formed. This embodiment is similar to the embodiments discussed above with reference to FIGS. 9-12, except the interface between the semiconductor substrate 510 and the one or more dielectric layers 514 is used as an etch stop, rather than the electronic circuitry 512 (see FIG. 11) or the metal line (see FIG. 12). To increase the etch selectivity, it may be desirable to use a silicide region or other structure formed at the interface between the semiconductor substrate 510 and the one or more dielectric layers 514. For example, in an embodiment, the silicide region formed in the source/drain region of, e.g., a transistor electronic circuitry 512, is utilized as an etch stop. In this example, the TSV 1310 may be used to directly contact the source/drain region of a transistor. A barrier layer 1312 may also be formed. Similar processes and materials may be used to form the TSV 1310 and the barrier layer 1312, including an etch-back process to protrude the TSV 1310 from a surface of the semiconductor substrate 510, as discussed above with reference to FIGS. 9-11.

Thereafter, other BEOL processing techniques suitable for the particular application may be performed. For example, wafer-to-wafer, wafer-to-die, or die-to-die bonding techniques may be used, redistribution lines may be formed, passivation layers may be formed, an encapsulant may be formed, a singulation process may be performed, and the like.

One of ordinary skill in the art will realize that the V-shaped and inverted V-shaped TSVs discussed above may be utilized in many different configurations. For example, the TSVs discussed above may be used to provide electrical contact to electronic circuitry on the same die, or to pass electrical signals between other dies and/or carrier boards. As such, a die having the TSVs discussed above may be mounted to another die and/or a carrier board.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
    a substrate;
    one or more dielectric layers overlying the substrate; and
    a through-silicon via (TSV) extending through the substrate, the TSV having sidewalls with a scalloped surface, scallops along the sidewalls having a depth greater than 0.01 µm, wherein the TSV narrows as it extends from a backside of the substrate to a device side of the substrate.

2. The semiconductor device of claim 1, wherein the TSV makes direct contact with electronic circuitry formed on the substrate.

3. The semiconductor device of claim 2, wherein the electronic circuitry comprises a metal gate electrode.

4. The semiconductor device of claim 1, wherein the TSV makes direct contact with a metal layer.

5. The semiconductor device of claim 1, wherein the TSV terminates at an interface between the substrate and the one or more dielectric layers.

6. The semiconductor device of claim 5, wherein the interface comprises a silicide.

7. The semiconductor device of claim 1, wherein the sidewalls are sloped at an angle greater than about 0.5 degrees relative to a normal surface of the substrate.

8. A semiconductor device comprising:
a substrate;
one or more dielectric layers overlying the substrate; and
a through-silicon via (TSV) extending through the substrate, the TSV having sidewalls with a scalloped surface, scallops along the sidewalls having a depth greater than 0.01 μm, wherein the TSV narrows as it extends from a device side of the substrate to a backside of the substrate.

9. The semiconductor device of claim 8, wherein the TSV makes direct contact with electronic circuitry formed on the substrate.

10. The semiconductor device of claim 9, wherein the electronic circuitry comprises a metal gate electrode.

11. The semiconductor device of claim 8, wherein the TSV makes direct contact with a metal layer.

12. The semiconductor device of claim 8, wherein the TSV terminates at an interface between the substrate and the one or more dielectric layers.

13. The semiconductor device of claim 12, wherein the interface comprises a silicide.

14. The semiconductor device of claim 8, wherein the sidewalls are sloped at an angle greater than about 0.5 degrees relative to a normal surface of the substrate.

15. A semiconductor device comprising:
a substrate;
one or more dielectric layers overlying the substrate; and
a through-silicon via (TSV) extending through the substrate, the TSV having a plurality of scalloped regions such that a width of the TSV in each scalloped region is smaller than a width of the TSV in a previous scalloped region as the TSV extends from a first side of the substrate to a second side of the substrate.

16. The semiconductor device of claim 15, wherein the TSV makes direct contact with electronic circuitry formed on the substrate.

17. The semiconductor device of claim 16, wherein the electronic circuitry comprises a metal gate electrode.

18. The semiconductor device of claim 15, wherein the TSV makes direct contact with a metal layer.

19. The semiconductor device of claim 15, wherein the TSV terminates at an interface between the substrate and the one or more dielectric layers.

20. The semiconductor device of claim 15, wherein sidewalls of the TSV are sloped at an angle greater than about 0.5 degrees relative to a normal surface of the substrate.

* * * * *